United States Patent
Okada

(10) Patent No.: US 8,288,732 B2
(45) Date of Patent: Oct. 16, 2012

(54) IMAGE SIGNAL READOUT METHOD AND APPARATUS, AND IMAGE SIGNAL READOUT SYSTEM

(75) Inventor: Yoshihiro Okada, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 1343 days.

(21) Appl. No.: 11/954,077

(22) Filed: Dec. 11, 2007

(65) Prior Publication Data

US 2008/0136743 A1    Jun. 12, 2008

(30) Foreign Application Priority Data

Dec. 12, 2006 (JP) .................................. 2006-334179

(51) Int. Cl.
*H01L 27/146* (2006.01)
(52) U.S. Cl. ................................. 250/370.09
(58) Field of Classification Search .............. 250/370.09
See application file for complete search history.

(56) References Cited

U.S. PATENT DOCUMENTS

2003/0043967 A1* 3/2003 Aufrichtig et al. ............ 378/207
2006/0056588 A1   3/2006 Endo

FOREIGN PATENT DOCUMENTS

| JP | 58-156272   | A | 9/1983  |
|----|-------------|---|---------|
| JP | 10-170658   | A | 6/1998  |
| JP | 2000-324401 | A | 11/2000 |
| JP | 2003-319264 | A | 11/2003 |
| JP | 2003-325495 | A | 11/2003 |
| JP | 2005-080692 | A | 3/2005  |
| JP | 2005-167773 | A | 6/2005  |
| JP | 2006-014163 | A | 1/2006  |

OTHER PUBLICATIONS

Communication pursuant to Article 94(3) EPC, dated Sep. 30, 2010, issued in corresponding EP Application No. 07 023 895.1, 5 pages.
EP Communication, dated Aug. 11, 2009, issued in corresponding EP Application No. 07023895.1, 5 pages.
Notice of Grounds for Rejection, dated Sep. 13, 2011, issued in corresponding JP Application No. 2006-334179, 6 pages in English and Japanese.

* cited by examiner

*Primary Examiner* — Christine Sung
(74) *Attorney, Agent, or Firm* — Sughrue Mion, PLLC

(57) ABSTRACT

An image signal readout method for reading out an image signal from an image detector including multitudes of pixels, each having a TFT switch, disposed two-dimensionally, in which a leak level flowing out to each of the data lines are detected with a signal for switching OFF the TFT switches being applied to each of the scanning lines prior to reading out the image signal.

6 Claims, 6 Drawing Sheets

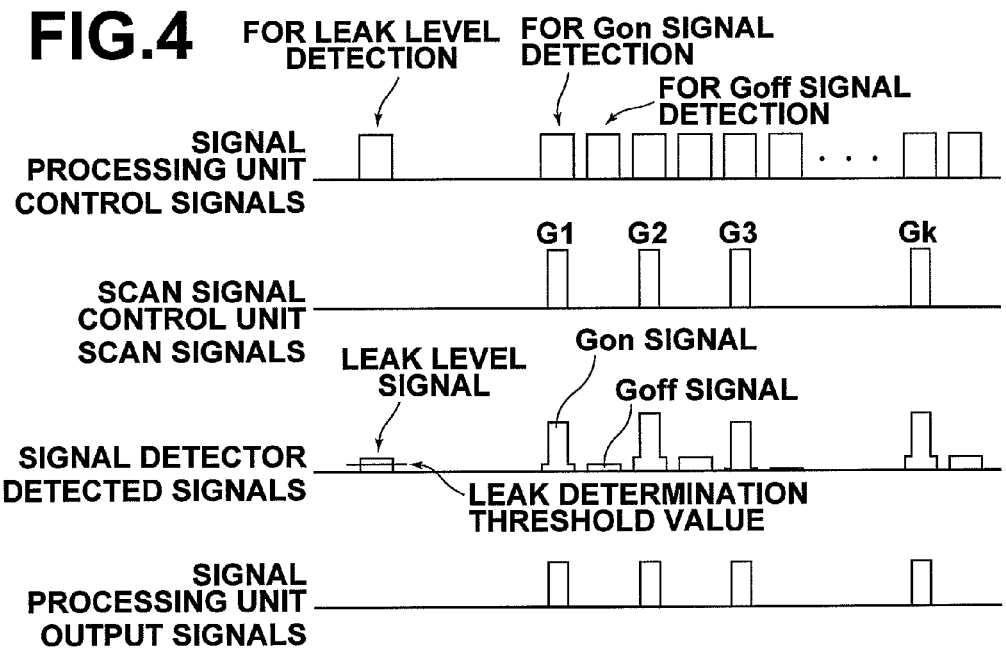
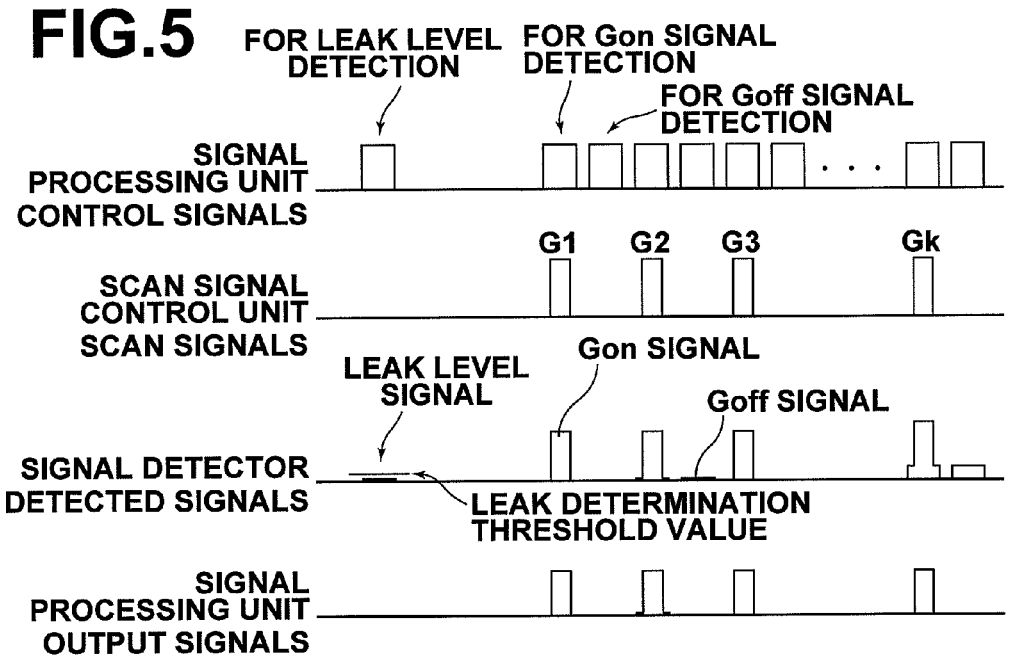

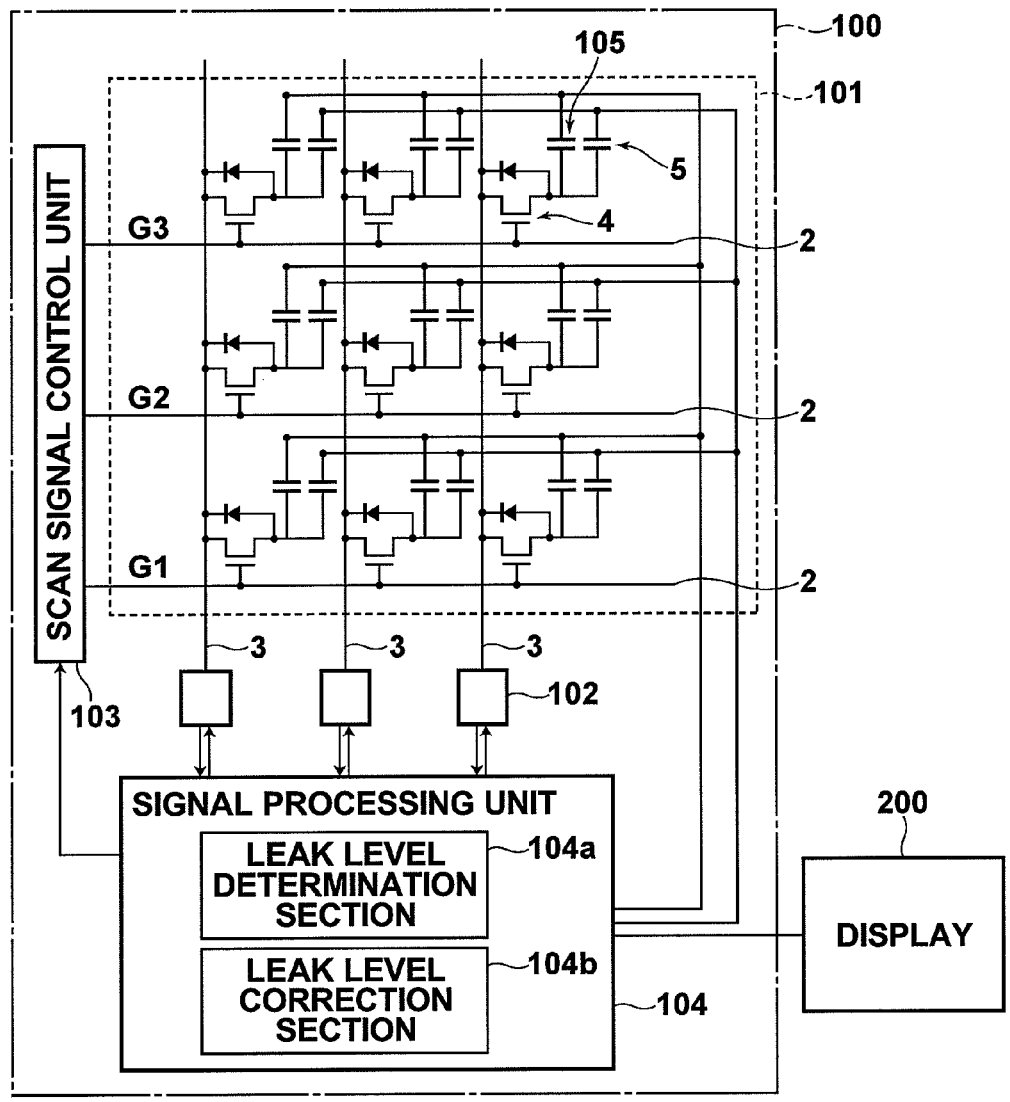

IMAGE SIGNAL READOUT METHOD AND APPARATUS, AND IMAGE SIGNAL READOUT SYSTEM

BACKGROUND OF THE INVENTION

1. Field of the Invention

The present invention relates to an image signal readout method and apparatus, and an image signal readout system for reading out an image signal from an image detector which includes multitudes of pixels, each having a TFT switch, disposed two-dimensionally.

2. Description of the Related Art

Recently, flat panel detectors (FPDs) having a TFT active matrix array on which an X-ray sensitive layer is disposed have been put into practical use. They are capable of directly converting X-ray information to digital data, and have an advantage over the conventional imaging plates in that they allow instantaneous image verification and motion image monitoring, so that they are spreading rapidly.

First, the structure of a conventional radiation image detector will be described with reference to FIG. 7. FIG. 7 is a schematic equivalent circuit of 3×3 pixels. In FIG. 7, the reference numerals 111, 112, 113, and 114 respectively denote a photoelectric conversion element, a TFT switch, a scanning wire, and a data wire.

Radiation, such as X-rays or the like, enters from above the surface of FIG. 7, which is converted to electrical signals by the photoelectric conversion elements 111 and the charges thereof are stored in each of the pixels. Thereafter, the TFT switches 112 are sequentially activated by the scanning wires 113 to transfer the stored charges to the data wires 114 connected to either one of the source/drain electrodes of the TFT switches 112, and the charges are detected by the signal detectors 115.

Such radiation image detector called FPD has characteristic features that accurate radiation images are detected since it is capable of directly detecting image signals. But, there may be cases in which various types of noise are added to the essential image signals to be detected due to various reasons.

For example, one type of noise is caused by leak current of the TFT switch. It is preferable that no leak current flows through the TFT switch that selects a pixel to be detected while it is in OFF state. But, a certain amount of leak current flows due to the characteristics of the device, which is added to the image signals. In order to solve this problem, Japanese Unexamined Patent Publication No. 2003-319264 proposes a method in which the leak current is read out from each of the TFT switches while it is in OFF state, and image signals are corrected using the value of the leak current of each of the TFT switches.

The method proposed in Japanese Unexamined Patent Publication No. 2003-319264, however, does not necessarily improve the quality of an image. Because, the method uses a process for subtracting a leak current component from the image signal in the correction of the amount of leak current. The leak current component is random noise, so that the subtraction of the leak current component from the image signal only results in the addition of the leak current component to the image signal and the amount of noise is increased. Thus, the method has a problem that it may degrade image quality.

In view of the circumstances described above, it is an object of the present invention to provide an image signal readout method and apparatus, and an image signal readout system capable of reading out an image signal from an image detector without causing image quality degradation described above.

SUMMARY OF THE INVENTION

The image signal readout method of the present invention is a method for reading out an image signal from an image detector including a charge generation layer that generates charges by receiving a recording electromagnetic wave and a detection layer stacked on top of another, the detection layer including: multitudes of pixels, each having a collection electrode for collecting the charges generated in the charge generation layer, a capacitor for storing the charges collected by the charge collection electrode, and a TFT switch for reading out the charges stored in the capacitor; multitudes of scanning lines for switching ON/OFF the TFT switches; and multitudes of data lines through which the charges stored in the capacitors are read out, wherein a leak level flowing out to each of the data lines is detected with a signal for switching OFF the TFT switches being applied to each of the scanning lines prior to reading out the image signal.

In the image signal readout method of the present invention described above, an arrangement may be adopted in which a correction of the image signal is performed based on the leak level only when the leak level exceeds a predetermined threshold value.

Further, the correction of the image signal based on the leak level may include the steps of: detecting an image signal by sequentially switching ON each group of the TFT switches connected to each of the scanning lines; detecting the leak level every time the image signal with respect to each of the scanning lines is detected; and generating a corrected image signal by performing an arithmetic operation between the image signal detected with respect to each of the scanning lines and the leak level.

The image signal readout apparatus of the present invention is an apparatus including:

an image detector including a charge generation layer that generates charges by receiving a recording electromagnetic wave and a detection layer stacked on top of another, the detection layer including: multitudes of pixels, each having a collection electrode for collecting the charges generated in the charge generation layer, a capacitor for storing the charges collected by the charge collection electrode, and a TFT switch for reading out the charges stored in the capacitor; multitudes of scanning lines for switching ON/OFF the TFT switches; and multitudes of data lines through which the charges stored in the capacitors are read out;

an image signal readout section for reading out an image signal from the image detector; and a leak level detection section for detecting a leak level flowing out to each of the data lines with a signal for switching OFF the TFT switches being applied to each of the scanning lines prior to reading out the image signal.

The image signal readout apparatus of the present invention described above may further include a leak level correction section for performing a correction on the image signal based on the leak level detected by the leak level detection section only when the leak level exceeds a predetermined threshold value.

Further, the leak level correction section may be a section that performs the correction on the image signal based on the leak levels by detecting an image signal by sequentially switching ON each group of the TFT switches connected to each of the scanning lines, detecting the leak level every time the image signal with respect to each of the scanning lines is detected, and generating a corrected image signal by performing an arithmetic operation between the image signal detected with respect to each of the scanning lines and the leak level.

Still further, the image detector may be a detector for detecting radiation.

Further, the image detector may be a detector that generates charges by directly receiving radiation on the charge generation layer.

Further, the image detector may be a detector having a mechanism for leaking a portion of the charges stored in the capacitor to the data line independent of ON/OFF switching of the TFT switch when the amount of charges stored in the capacitor exceeds a certain amount.

The image signal readout system of the present invention is a system including:

the image signal readout apparatus described above; and a mechanism for outputting the output of the image signal readout apparatus to a printer, a video processing device, or a display.

According to the image signal readout method and apparatus, and the image signal readout system of the present invention, a leak level flowing out to each of the data lines is detected with a signal for switching OFF the TFT switches being applied to each of the scanning lines prior to reading out the image signal. Therefore, if an arrangement is adopted, for example, in which the correction of the image signal is performed based on the leak level only when the leak level exceed a predetermined threshold value, and the correction of the image signal based on the leak level is not performed when the leak level is not greater than the threshold value, image quality degradation arising from subtraction of the leak level from the image signal may be prevented when the leak level is low.

BRIEF DESCRIPTION OF THE DRAWINGS

FIG. 4 is a timing chart illustrating an operation of the radiation image signal readout display system.

FIG. 5 is a timing chart illustrating an operation of the radiation image signal readout display system.

FIG. 6 is an alternative equivalent circuit diagram of the radiation image detector.

DESCRIPTION OF THE PREFERRED EMBODIMENTS

Hereinafter, a radiation image signal readout display system to which an embodiment of the image signal readout apparatus of the present invention is applied will be described with reference to the accompanying drawings.

Figure 1:
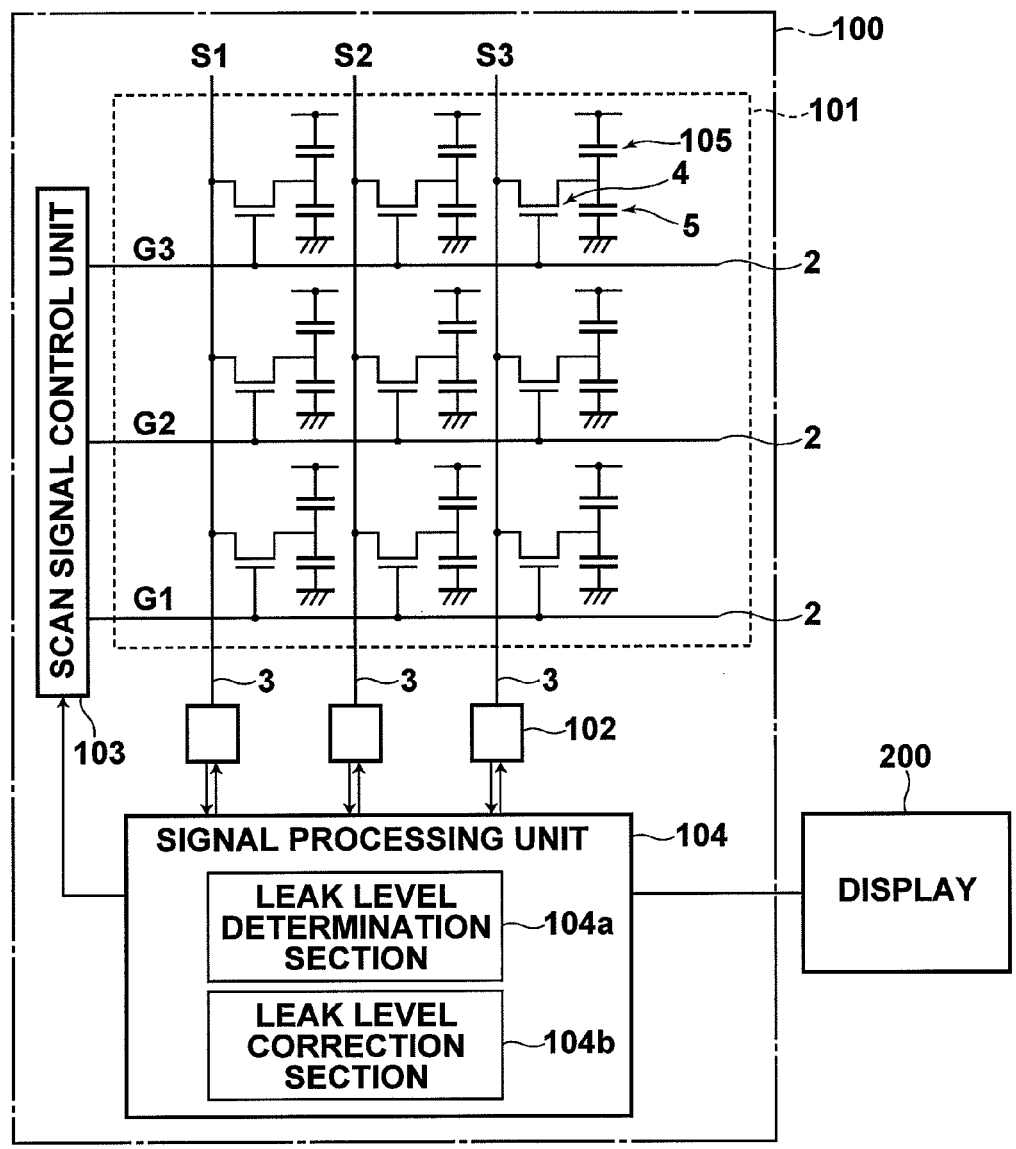
FIG. 1 is a schematic configuration diagram of a radiation image signal readout display system to which an embodiment of the image signal readout apparatus of the present invention is applied.

A schematic configuration diagram of the radiation image signal readout display system is shown in FIG. 1.

As illustrated in FIG. 1, the radiation image signal readout display system includes: a radiation image signal readout unit 100 for reading out radiation image signals from a radiation image detector; and a display 200 for displaying a radiation image based on the radiation image signals read out by the radiation image signal readout unit 100.

The radiation image signal readout unit 100 includes: a radiation image detector 101; a signal detector 102 for detecting radiation image signals outputted from the radiation image detector 101; a scan signal control unit 103 for outputting scan signals to the scanning wires of the radiation image detector 101; and a signal processing unit 104 for obtaining the signals detected by the signal detector 102 and outputting to the display 200 as video signals, and for outputting control signals to the scan signal control unit 103 and signal detector 102.

The radiation image detector 101 includes multitudes of pixels disposed two-dimensionally. Each pixel includes: an image sensor section 105 having a bias electrode, a semiconductor film, and a charge collection electrode to be described later; a capacitor 5 for storing the charge signals detected by the image sensor section 105; and a TFT switch 4 for reading out the charges stored in the capacitor 5. In addition, multitudes of scanning wires 2 for switching ON and OFF the TFT switches 4, and multitudes of data wires 3 through which the charges stored in the capacitors 5 are read out.

The signal processing unit 104 includes: a leak level determination section 104a for determining whether a leak level signal (to be described later) is greater than a leak level determination threshold value; and a leak level correction section 104b for correcting radiation image signals based on the leak level signal only when the leak level is determined to be greater than a predetermined leak level threshold value by the leak level determination section 104a.

Figure 2:
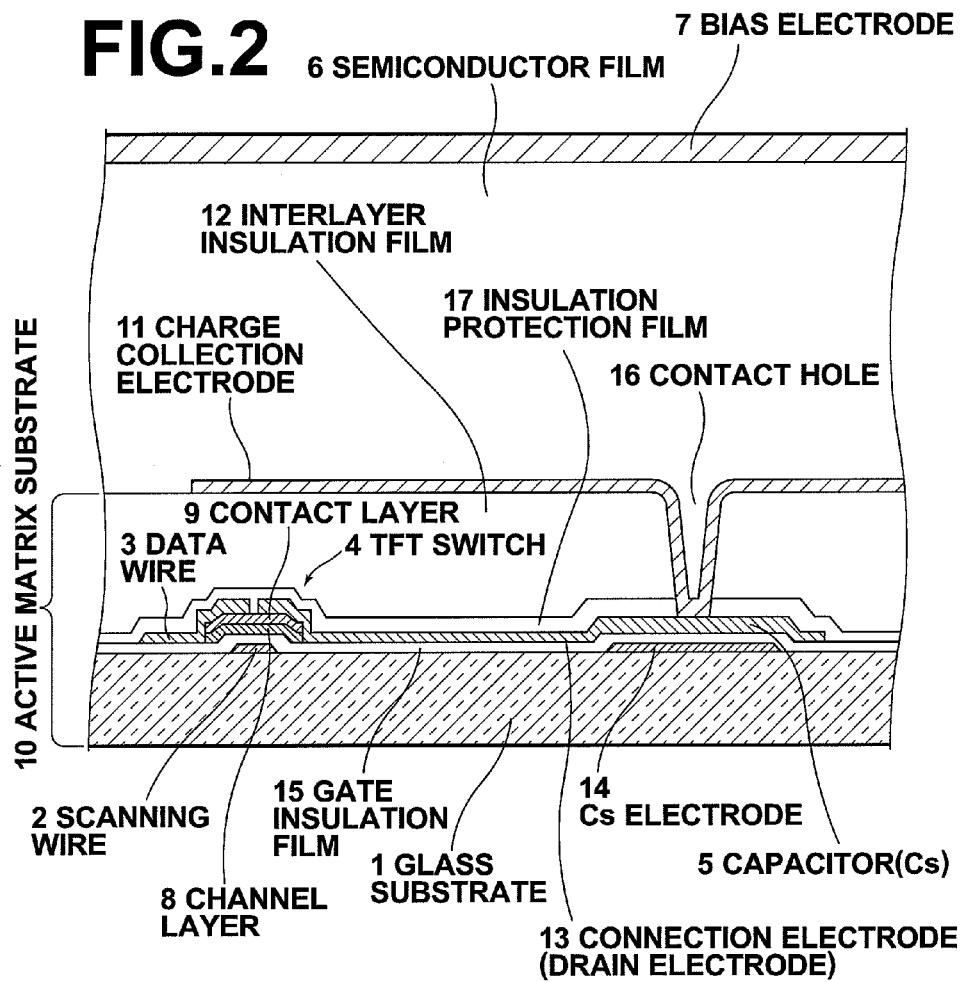
FIG. 2 is a cross-sectional view of the radiation image detector, illustrating the structure of a single pixel.
Figure 3:
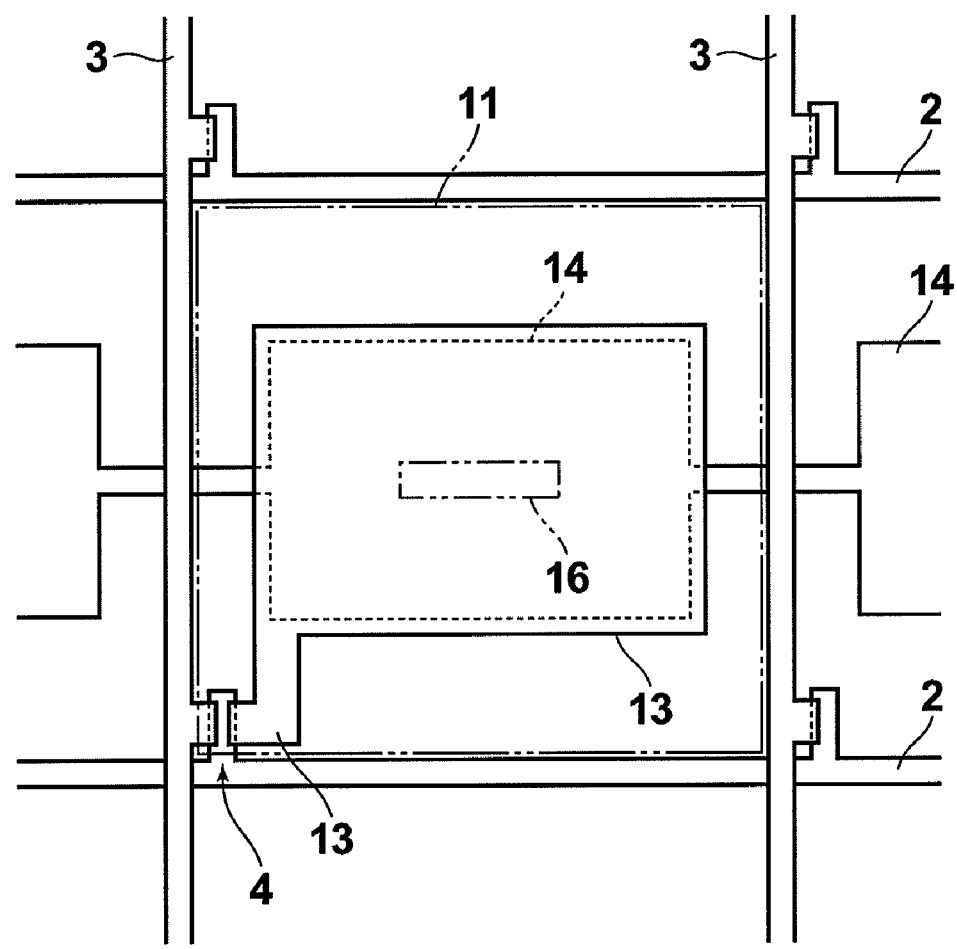
FIG. 3 is a plan view of the radiation image detector, illustrating the structure of a single pixel.
Figure 7:
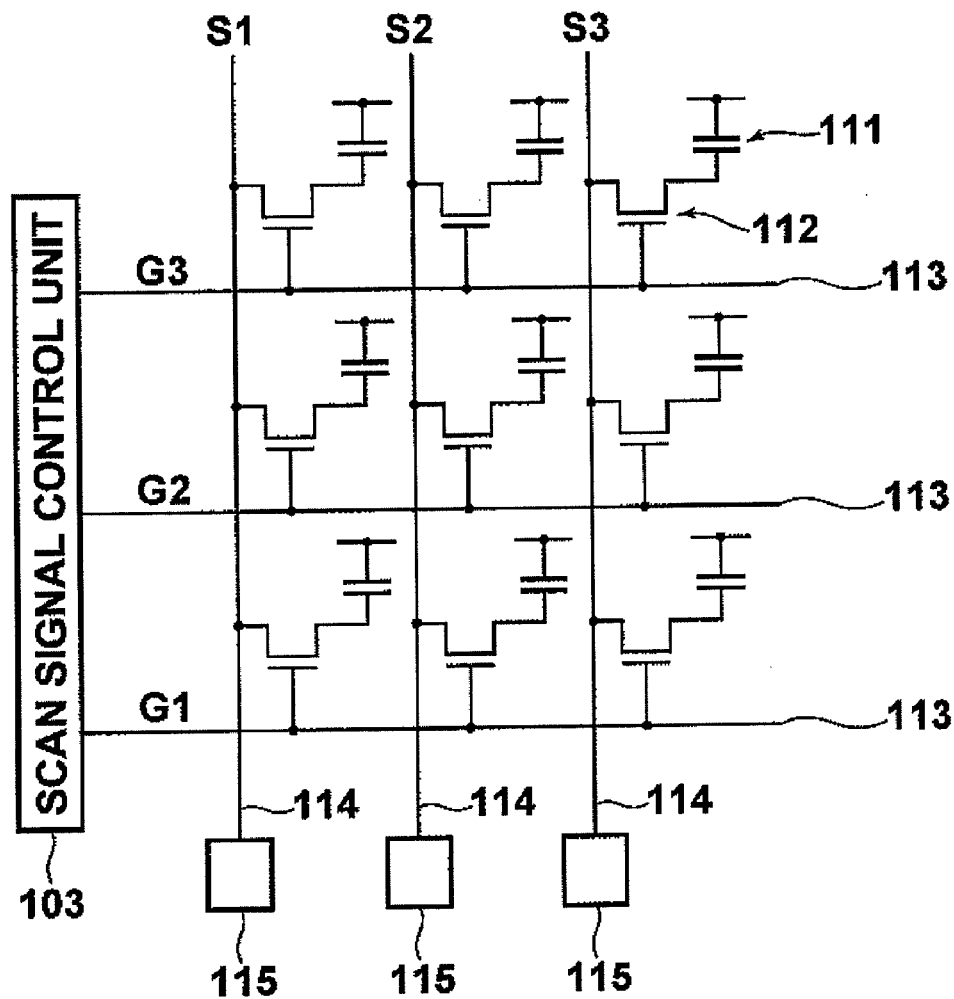
FIG. 7 is an equivalent circuit diagram of a conventional radiation image detector.

Now, the radiation image detector 101 will be described in more detail. FIG. 2 is a cross-sectional view of the radiation image detector 101, illustrating the structure of a single pixel, and FIG. 3 is a plan view thereof.

As illustrated in FIG. 2, the radiation image detector 101 includes an active matrix substrate 10 on which a semiconductor film 6 having electromagnetic conductivity, and a bias electrode (common electrode) 7 connected to a not shown high voltage power source are stacked in this order. The semiconductor film 6 generates charges (electron-hole pairs) when irradiated with an electromagnetic wave, such as X-rays or the like. That is, the semiconductor film 6 has electromagnetic conductivity, and provided for converting image information represented by X-rays to charge information. The semiconductor film 6 is, for example, made of selenium-based amorphous a-Se (amorphous selenium). The referent of "selenium-based" as used herein means that selenium is included 50% or more.

Hereinafter, the active matrix substrate 10 will be described in more detail.

The active matrix substrate 10 includes a glass substrate 1, a scanning wire 2, a capacitor electrode (Cs electrode) 14, a gate insulation film 15, a connection electrode 13, a channel layer 8, a contact layer 9, a data wire 3, an insulation protection film 17, an interlayer insulation film 12, and a charge collection electrode 11.

The thin film transistor (TFT) 4 is formed by the scanning wire 2, gate insulation film 15, data wire 3, connection electrode 13, channel layer 8, contact layer 9, and the like, and the capacitor (Cs) 5 is formed by the Cs electrode 14, gate insulation film 15, connection electrode 13, and the like.

The glass substrate 1 is the supporting substrate and, for example, non-alkali glass (Corning 1737 glass or the like) may be used for this purpose. The scanning wires 2 and data wires 3 are electrode wires disposed in a grid pattern, and the thin film transistor (TFT) 4 is formed at each of the intersections thereof. The TFT switch 4 is a switching element, and the source and drain thereof are connected to the data wire 3 and connection electrode 13 respectively. The data wire 3 is the source electrode and the connection electrode 13 is the drain electrode of the TFT switch 4. That is, the data wire includes a linear portion serving as the signal wire and an extended portion for forming the TFT switch 4. The connection electrode 13 is provided to connect the TFT switch 4 with the capacitor 5.

The gate insulation film 15 is made of SiNx, SiOx, or the like. The gate insulation film 15 is disposed to cover the scanning wire 2 and Cs electrode 14, and the portion located over the scanning wire 2 acts as the gate insulation film of the TFT switch 4, and the portion located over the Cs electrode 14 acts as the dielectric layer of the capacitor 5. That is, the capacitor 5 corresponds to the region where the Cs electrode 14, which is formed on the same layer as the scanning wire 2, and the connection electrode 13 are stacked on top of another. It is noted that an anodized oxide film obtained by anodizing the scanning wirer 2 and Cs electrode 14 may also be used in combination with SiNx or SiOx for the gate insulation film 15.

The channel layer (i layer) 8 corresponds to the channel section of the TFT switch 4, which is a current channel for connecting between the data wire 3 and connection electrode 13. The contact layer ($n^+$ layer) 9 provides a contact between the data wire 3 and connection electrode 13.

The insulation protection film 17 extends substantially the entire surface (area) over the data wire 3 and connection electrode 13, i.e., over the glass substrate 1. The insulation protection film 17 provides electrical insulation between the data wire 3 and connection electrode 13, as well as protection for them. The insulation protection film 17 has a contact hole 16 at a predetermined position, i.e., the position over the portion of the connection electrode 13 facing the Cs electrode 14 across the capacitor 5.

The charge collection electrode 11 is made of a transparent conductive amorphous oxide film. The charge collection electrode 11 is formed to fill the contact hole 16 and stacked over the data wire 3 and connection electrode 13. The charge collection electrode 11 is electrically communicating with the semiconductor film 6 so as to be able to collect charges generated in the semiconductor film 6.

The interlayer insulation film 12 is made of an acrylic resin having photosensitivity and provides electrical insulation for the TFT switch 4. The contact hole 16 runs through the interlayer insulation film 12, and the charge collection electrode 11 is connected to the connection electrode 13.

The scanning wire 2 and Cs electrode 14 are provided on the glass substrate 1. The channel layer (i layer) 8 and contact layer ($n^+$ layer) 9 are stacked in this order over the scanning wire 2 via the gate insulation film 15. The data wire 3 and connection electrode 13 are formed on the contact layer 9. The connection electrode 13 is stacked over the layer forming the capacitor 5. The insulation protection layer 17 is disposed on the connection electrode 13 and data wire 3.

The interlayer insulation film 12 of the TFT switch 4 is provided on the insulation protection layer 17. The charge collection electrode 11 is provided in the upper layer of the interlayer insulation film 12, i.e., the uppermost layer of the active matrix substrate 10. The charge collection electrode 11 is connected to the TFT switch 4 through the connection electrode 13.

The gate insulation film 15 is provided on the Cs electrode 14, and the connection electrode 13 is disposed on the gate insulation film 15. The charge collection electrode 11 is connected to the connection electrode 13 through the contact hole 16 running through the interlayer insulation film 12.

A not shown high voltage power source is connected between the bias electrode 7 and Cs electrode 14. A voltage is applied between the bias electrode 7 and Cs electrode 14 by the high voltage power source, which causes an electric field to be generated between the bias electrode 7 and Cs electrode 14 across the capacitor 5. Here, the semiconductor film 6 and capacitor 5 are electrically connected in series, so that when a bias voltage is applied to the bias electrode 7, charges (electron-hole pairs) are generated in the semiconductor film 6. The electrons generated in the semiconductor film 6 are moved to the side of positive electrode and holes are moved to the side of negative electrode, causing charges to be stored in the capacitor 5.

As for the entire radiation image detector, a plurality of charge collection electrodes 11 is disposed two-dimensionally, and a plurality of capacitors 5, each connected to each charge collection electrode 11 and a plurality of TFT switches 4, each connected to each capacitor 5 are provided. This allows two-dimensional electromagnetic information to be tentatively stored in the capacitors 5, and the two-dimensional charge information may be read out easily by sequentially scanning the TFT switches 4.

An example manufacturing process of the radiation image detector will now be described.

First, a metal film of Ta, Al, or the like is formed on the glass substrate 1 by sputter deposition with a thickness of approximately 300 nm, and the scanning wires 2 and Cs electrodes 14 are formed by patterning the film in a desired shape.

Next, the gate insulation film 15 made of SiNx, SiOx, or the like is formed substantially over the entire surface of the glass substrate 1 with a thickness of approximately 350 nm by CVD (Chemical Vapor Deposition) so as to cover the scanning wires 2 and Cs electrodes 14. It is noted that an anodized oxide film obtained by anodizing the scanning wirers 2 and Cs electrodes 14 may also be used in combination with SiNx or SiOx for the gate insulation film 15.

Then, amorphous silicon (a-Si) film is formed by CVD with a thickness of approximately 100 nm such that the channel layers 8 are disposed over the scanning wires 2 via the gate insulation film 15, and the channel layers 8 are formed by patterning the film in a desired shape.

Next, a-Si film is formed by CVD with a thickness of approximately 40 nm such that the contact layers 9 are disposed in the upper layer of the channel layers 8, and the contact layers 9 are formed by patterning the film in a desired shape.

Further, a metal film of Ta, Al, or the like is formed on the contact layers 9 with a thickness of approximately 300 nm, and data wires 3 and connection electrodes 13 are formed by patterning the film in a desired shape.

Then, in order to form the insulation protection film 17, a SiNx film substantially covering the entire region of the glass substrate 1, having the TFT switches 4, capacitors 5, and the like formed thereon, is formed by CVD with a thickness of approximately 300 nm. Thereafter, the SiNx film formed on a predetermined portion of the connection electrode 13 is removed to create a portion of the contact hole 16.

Next, in order to form the interlayer film 12, an acrylic resin film or the like having photosensitivity is formed with a thickness of approximately 3 μm to cover substantially the entire surface of the insulation protection film 17. Then, patterning is performed by photolithography technique to form a portion of the contact hole 16 by aligning with the portion of the contact hole 16 of the insulation protection film 17.

Then, a transparent conductive amorphous oxide film, such as ITO (Indium-Tin-Oxide) film, is formed on the interlayer insulation layer 12 by sputter deposition with a thickness of approximately 200 nm, and the charge collection electrodes 11 are formed by patterning the film in a desired shape. Here, each charge collection electrode 11 is electrically communicated (short-circuited) with each connection electrode 13 through each contact hole 16 running through the insulation protection layer 17 and interlayer insulation film 12.

In the present embodiment, the active matrix substrate 10 adopts a so-called roof structure (mushroom electrode structure) in which the charge collection electrode 11 overlaps with the TFT switch 4 on the upper side thereof as described above. But, a non-roof structure may also be adopted. Further, as the switching element, the TFT 4 using a-Si is employed, but p-Si (poly silicon) may also be used. Still further, although an inversely staggered structure in which the data wires 3 and connection electrodes 13 are positioned above the scanning wires 2 via the gate insulation film 15 is adopted, a staggered structure may also be employed.

Next, the semiconductor film 6 of a-Se (amorphous selenium) having electromagnetic wave conductivity is formed to cover the entire pixel array region of the active matrix substrate 10 by vacuum deposition with a thickness of approximately 0.5 to 1.5 mm.

Finally, the bias electrode 7 of Au, Al, or the like is formed on substantially the entire surface of the semiconductor film 6 by vacuum deposition with a thickness of approximately 200 nm.

It is noted that a charge injection blocking layer for blocking electrons or holes from entering into the semiconductor film 6, or a buffer layer for improving contact between the semiconductor layer 6 and charge collection electrode 11 may be provided at the interface between the semiconductor layer 6 and charge collection electrode 11. Likewise, a charge injection blocking layer or a buffer layer may be provided at the interface between the semiconductor film 6 and bias electrode 7. As for the material of the charge injection blocking layer or buffer layer, a-Se including a-$As_2Se_3$, alkali element ion, or halogen element ion added thereto, or the like may be used.

Next, the operational principle of the radiation image detector structured in the aforementioned manner will be described. When X-rays are irradiated on the semiconductor film 6 while a voltage is applied between the bias electrode 7 and Cs electrodes 14, charges (electron-hole pairs) are generated in the semiconductor film 6. The electrons generate in the semiconductor film 6 are moved to the side of positive electrode and holes are moved to the side of negative electrode, causing charges to be stored in the capacitors 5, since the semiconductor film 6 and each of the capacitors 5 are electrically connected in series.

Charges stored in each of the capacitors 5 may be read out to outside through the data wire 3 by inputting a signal to the scanning wire 2 and switching ON the TFT switch.

The scanning wires 2, data wires 3, TFT switches 4, and capacitors 5 are all provided in XY matrices, so that the image information represented by the X-rays may be obtained two-dimensionally by sequentially scanning the signal to be inputted to the scanning wires 2 and detecting the signals from the data wires 3 with respect to each data wire 3.

Next, an operation of the radiation image signal readout unit 100 will be described with reference to FIGS. 1, 4, and 5.

First, recording of X-ray image data is performed by irradiating X-rays on the radiation image detector 101 as described above. Charges generated in the semiconductor film 6 according to the amount of irradiated X-rays are collected to each charge collection electrode 11 and stored in the capacitor 5 electrically connected to each charge collection electrode 11 as described above.

Then, as illustrated in FIG. 4, a control signal for leak level detection is outputted from the signal processing unit 104 to the signal detector 102 prior to obtaining radiation image signals. Next, with a signal for switching OFF the TFT switches 4 being applied to each scanning wire 2, a signal flowing out to each data wire 3 is detected by the signal detector 102 connected thereto. Then, the signals detected by the respective signal detectors 102 are outputted to the signal processing unit 104, where the signals are averaged and the averaged signal is obtained as a leak level signal. Next, the leak level signal is outputted to the leak level determination section 104a, where a determination is made as to whether or not the leak level signal is greater than a leak determination threshold value, as illustrated in FIG. 4.

Then, a control signal for Gon signal detection is outputted from the signal processing unit 104 to the scan signal control unit 103, and according to the control signal, a scan signal for switching ON the TFT switches 4 is outputted from the scan signal control unit 103 to the scanning wire G1. Here, the control signal for Gon signal detection is also outputted to each signal detector 102 from the signal processing unit 104, and according to the control signal, each signal detector 102 detects a signal flowing out to the data wire 3 connected thereto.

Next, a control signal for Goff signal detection is outputted from the signal processing unit 104 to the scan signal control unit 103, and according to the control signal, a signal for switching OFF the TFT switches is outputted from the scan signal control unit 103 to each scanning wire. Here, the control signal for Goff signal detection is also outputted to each signal detector 102 from the signal processing unit 104, and according to the control signal, each signal detector 102 detects a signal flowing out to the data wire 3 connected thereto.

Then, the Gon signal detected by each signal detector 102 according to the control signal for Gon signal detection, and the Goff signal detected by each signal detector 102 according to the control signal for Goff signal detection are outputted to the leak level correction section 104b. If the leak level is determined, by the leak level determination section 104a, to be greater than the leak determination threshold value, the leak level correction section 104b subtracts the Goff signal from the Gon signal to obtain a radiation image signal.

Next, the control signal for Gon signal detection is outputted again from the signal processing unit 104 to the scan signal control unit 103, and according to the control signal, the scan signal for switching ON the TFT switches 4 is outputted from the scan signal control unit 103 to the scanning wire G2. Here, the control signal for Gon signal detection is also outputted to each signal detector 102 from the signal processing unit 104, and according to the control signal, each signal detector 102 detects a signal flowing out to the data wire 3 connected thereto.

Next, the control signal for Goff signal detection is outputted from the signal processing unit 104 to the scan signal control unit 103, and according to the control signal, the signal for switching OFF the TFT switches is outputted from the scan signal control unit 103 to each scanning wire. Here, the control signal for Goff signal detection is also outputted to each signal detector 102 from the signal processing unit 104, and according to the control signal, each signal detector 102 detects a signal flowing out to the data wire 3 connected thereto.

Then, the Gon signal detected by each signal detector 102 according to the control signal for Gon signal detection, and the Goff signal detected by each signal detector 102 according to the control signal for Goff signal detection are outputted to the leak level correction section 104b. If the leak level is determined, by the leak level determination section 104a, to be greater than the leak determination threshold value, the leak level correction section 104b subtracts the Goff signal from the Gon signal to obtain a radiation image signal.

Thereafter, the control signal for Gon signal detection and the control signal for Goff signal detection are alternately outputted from the signal processing unit 104 in the manner as described above. Then, according to the control signal for Gon signal detection, the scan signal for switching ON the TFT switches 4 is sequentially outputted to the scanning wires 2, and while the scan signal is outputted, the signal for switching OFF the TFT switches is outputted to each scanning wire 2 according to the control signal for Goff signal detection, thereby the Gon signal and Goff signal are alternately obtained by each signal detector 102.

Then, the Gon signals and Goff signals alternately detected in the manner as described above are sequentially inputted to the leak level correction section 104b, where the Goff signals are sequentially subtracted from the Gon signals, thereby radiation image signals are obtained.

In the mean time, as illustrated in FIG. 5, if the leak level signal obtained according to the control signal for leak level detection is determined, by the leak level determination section 104a, to be not greater than the leak determination threshold value, the Gon signals and Goff signals are alternately obtained according to the control signal for Gon signal detection and the control signal for Goff signal detection in the same manner as described above, but in the leak level correction section 104b, the Gon signals are directly obtained as radiation image signals without subtracting the Goff signals from the Gon signals.

As described above, if the leak level signal is determined, by the leak level determination section 104a, to be greater than the leak determination threshold value, radiation image signals are obtained by sequentially performing subtractions between the alternately obtained Gon signals and Goff signals. On the other hand, if the leak level signal is determined, by the leak level determination section 104a, to be not greater than the leak determination threshold value, the Gon signals are obtained directly as radiation image signals. In the present embodiment, Goff signals are obtained even when the leak level signal is determined, by the leak level determination section 104a, to be not greater than the leak determination threshold value, an arrangement may be adopted in which Goff signals are not detected by the signal detectors 102 in such a case.

Then, the radiation image signals obtained by the leak level correction section 104b of the signal processing section 104 are converted to video signals and outputted to the display 200, thereby a radiation image is displayed on the display 200. In the radiation image signal readout display system according to the present embodiment, radiation image signals converted to video signals are outputted from the radiation image signal readout unit 100 to the display 200, but an arrangement may be adopted in which the radiation image signals are outputted to a printer and a radiation image is printed by the printer, or the radiation image signals are outputted to a video processing unit.

The leak level signal becomes high when the amount of X-rays irradiated on the radiation image detector 101 is great. This is because the leak current of the TFT switch 4 varies with the voltage between the drain and source. When the amount of irradiated X-rays is great, the amount of charges generated in the semiconductor film 6 becomes great, and the amount of charges stored in the capacitor 5 becomes great, thereby the drain voltage of the TFT switch 4 becomes high. This will result in the leak current to be increased, and the leak level signal, which is the sum of the leak currents of the TFT switches 4 connected to a single data wire 3, is also increased. Accordingly, when the amount of irradiated X-rays is great, the leak level correction is required. On the other hand, if the amount of irradiated X-rays is small, the leak level correction is not required in most cases, and image quality degradation may be prevented by not performing the leak level correction.

In the radiation image detector 101 illustrated in FIGS. 1 to 3, the charge collection electrode 11 is disposed over the TFT switch 4, and this structure may provide a protection circuit for protecting the TFT switch 4. Thus, the radiation image detector 101 shown in FIG. 1 may be represented by an equivalent circuit illustrated in FIG. 6. In the radiation image detector 101 shown in FIG. 6, if the amount of X-rays irradiated on the semiconductor film 6 is increased, the amount of charges stored in the capacitor 5 is increased in proportion to the amount of X-rays. For example, for a device in which the pixel potential becomes 10V with 10 mR, if 400 mR of X-rays is irradiated, the pixel potential reaches 400V. The withstand voltage of a general TFT switch is around 100V, so that the TFT switch having such withstand voltage is irreversibly destroyed. In the case of the radiation image detector 101 structured like that shown in FIG. 6, however, the leak current of the TFT switch 4 is gradually increased with the pixel potential from around 30V, and the charges stored in the pixel are leaked to the data wire 3, thereby the increase in the pixel potential is prevented. Accordingly, when a large amount of X-rays is irradiated on the radiation image detector 101, a large leak current flows out to the data wire 3, so that the performance of the leak level correction by the leak level correction section 104b as described above is effective. On the other hand, when the amount of X-rays irradiated on the radiation image detector 101 is around 10 mR, the pixel potential is only 10V, and the leak current is not greater than 10 pA, so that the leak correction by the leak level correction section 104b is not required.

In the radiation image detector 101 of the present embodiment, the protection circuit for protecting the TFT switch 4 is formed by disposing the charge collection electrode 11 over the TFT switch 4 as described above, but an arrangement may be adopted in which an n-type transistor is used as the TFT switch 4, and a negative voltage is used for the bias voltage of the semiconductor film. This arrangement does not require a protection circuit like that required by the radiation image detector 101 of the embodiment described above. In the negative bias arrangement, the pixel potential stored in the capacitor also becomes a negative potential, and if it falls below a certain voltage, which is below the low voltage (around −10V) of the gate, then the channel potential becomes higher and the TFT switch 4 is automatically switched ON. Thus, a leak mechanism is formed without providing a protection circuit like that described above, thereby the TFT switch 4 is prevented from breakage. In the structure describe above also, the arrangement may be adopted in which the leak current is detected, and performance or non-performance of the leak correction by the leak level correction section is switched according to the magnitude of the leak level as described above.

Further, in the embodiment described above, performance or non-performance of the leak correction by the leak level correction section is switched based on the leak level. But it is not limited to this, and, for example, the amount of X-rays to be irradiated on the radiation image detector may be changed based on the leak level. In motion image recording, for example, it is necessary to instantaneously optimize the amount of X-rays to be irradiated. A high leak level is highly related to a high X-ray exposure amount, so that the X-ray exposure amount may be optimized by feed-backing the leak level detected by the present invention to the X-ray source as the exposure correction signal.

Further, device management may be performed by constantly monitoring the leak level. The semiconductor film of the radiation image detector is inherently unstable due to the nature of the material. In particular, the performance is degraded by the temperature change. The increase in the leak level is highly related to the increase in the point defect due to performance degradation. Accordingly, an erroneous diagnosis arising from the increase in the point defect described above may be prevented by constantly sending leak level information to the system and the system is stopped when the leak level exceeds a predetermined threshold value.

What is claimed is:

1. An image signal readout method for reading out an image signal from an image detector comprising a charge generation layer that generates charges by receiving a recording electromagnetic wave and a detection layer stacked on top of another, the detection layer including: multitudes of pixels, each having a collection electrode for collecting the charges generated in the charge generation layer, a capacitor for storing the charges collected by the charge collection electrode, and a TFT switch for reading out the charges stored in the capacitor; multitudes of scanning lines for switching ON/OFF the TFT switches; and multitudes of data lines through which the charges stored in the capacitors are read out, wherein
   a leak level flowing out to each of the data lines are detected with a signal for switching OFF the TFT switches being applied to each of the scanning lines prior to reading out the image signal,
   wherein a correction of the image signal is performed based on the leak level only when the leak level exceeds a predetermined threshold value, and
   wherein the correction of the image signal based on the leak level comprises the steps of:
   detecting an image signal by sequentially switching ON each group of the TFT switches connected to each of the scanning lines;
   detecting the leak level every time the image signal with respect to each of the scanning lines is detected; and
   generating a corrected image signal by performing an arithmetic operation between the image signal detected with respect to each of the scanning lines and the leak level.

2. An image signal readout apparatus comprising:
   an image detector including a charge generation layer that generates charges by receiving a recording electromagnetic wave and a detection layer stacked on top of another, the detection layer including: multitudes of pixels, each having a collection electrode for collecting the charges generated in the charge generation layer, a capacitor for storing the charges collected by the charge collection electrode, and a TFT switch for reading out the charges stored in the capacitor; multitudes of scanning lines for switching ON/OFF the TFT switches; and multitudes of data lines through which the charges stored in the capacitors are read out;
   an image signal readout section for reading out an image signal from the image detector; and
   a leak level detection section for detecting a leak level flowing out to each of the data lines with a signal for switching OFF the TFT switches being applied to each of the scanning lines prior to reading out the image signal, and
   further comprising a leak level correction section for performing a correction on the image signal based on the leak level detected by the leak level detection section only when the leak level exceeds a predetermined threshold value,
   wherein the leak level correction section performs the correction on the image signal based on the leak level by detecting an image signal by sequentially switching ON each group of the TFT switches connected to each of the scanning lines, detecting the leak level every time the image signal with respect to each of the scanning lines is detected, and generating a corrected image signal by performing an arithmetic operation between the image signal detected with respect to each of the scanning lines and the leak level.

3. The image signal readout apparatus of claim 2, wherein the image detector is a detector for detecting radiation.

4. The image signal readout apparatus of claim 3, wherein the image detector is a detector that generates charges by directly receiving radiation on the charge generation layer.

5. The image signal readout apparatus of claim 2, wherein the image detector is a detector having a mechanism for leaking a portion of the charges stored in the capacitor to the data line independent of ON/OFF switching of the TFT switch when the amount of charges stored in the capacitor exceeds a certain amount.

6. An image signal readout system comprising:
   the image signal readout apparatus of claim 2; and
   a mechanism for outputting the output of the image signal readout apparatus to a printer, a video processing device, or a display.

* * * * *